(12) United States Patent
Beigel

(10) Patent No.: US 7,348,652 B2
(45) Date of Patent: Mar. 25, 2008

(54) BULK-ISOLATED PN DIODE AND METHOD OF FORMING A BULK-ISOLATED PN DIODE

(75) Inventor: Kurt D. Beigel, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 732 days.

(21) Appl. No.: 10/383,893

(22) Filed: Mar. 7, 2003

(65) Prior Publication Data

US 2004/0173867 A1 Sep. 9, 2004

(51) Int. Cl.
*H01L 29/00* (2006.01)
*G11C 7/10* (2006.01)

(52) U.S. Cl. ............... 257/499; 257/653; 257/E29.166; 365/189.06

(58) Field of Classification Search ............ 252/347, 252/350, 355, 360, 104, 106, 603, 520, 499; 252/653; 365/189.06
See application file for complete search history.

(56) References Cited

U.S. PATENT DOCUMENTS

| | | | | |
|---|---|---|---|---|
| 4,745,087 A | * | 5/1988 | Iranmanesh | 438/359 |
| 5,013,677 A | * | 5/1991 | Hozumi | 438/330 |
| 5,279,976 A | | 1/1994 | Hayden et al. | |
| 5,408,122 A | * | 4/1995 | Reele | 257/446 |
| 5,420,051 A | | 5/1995 | Bohr et al. | |
| 5,670,417 A | * | 9/1997 | Lambson et al. | 438/316 |
| 5,721,656 A | * | 2/1998 | Wu et al. | 361/56 |
| 6,352,882 B1 | * | 3/2002 | Assaderaghi et al. | 438/155 |
| 6,717,209 B1 | * | 4/2004 | Kim et al. | 257/328 |
| 2002/0033504 A1 | * | 3/2002 | Ohnnakado | 257/350 |
| 2004/0099910 A1 | * | 5/2004 | Choe et al. | 257/347 |

OTHER PUBLICATIONS

Office Action mailed Jun. 15, 2007, for Continuing U.S. Appl. No. 10/930,512 (filed Aug. 31, 2004).

* cited by examiner

*Primary Examiner*—Evan Pert
(74) *Attorney, Agent, or Firm*—Fletcher Yoder PC

(57) ABSTRACT

A technique for making a bulk isolated PN diode. Specifically, a technique is provided for making a voltage clamp with a pair of bulk isolated PN diode. Another embodiment provides for a voltage clamp with a pair of bulk isolated PN diodes in parallel with a pair of MOSFET diode-connected transistors. In addition, a method for manufacturing the bulk isolated PN diodes is recited.

42 Claims, 7 Drawing Sheets

BULK-ISOLATED PN DIODE AND METHOD OF FORMING A BULK-ISOLATED PN DIODE

BACKGROUND OF THE INVENTION

1. Field of the Invention

This present invention relates generally to the field of electronic circuitry and, more specifically, to forming diodes.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

In today's high-speed computer systems, the relative size of electronic devices is steadily decreasing as technology advances. Generally, the reduction in the overall footprint of the electronic components is due to the consumer's demand for smaller, more powerful electronic devices. The different components of an electronic system generate signals that are transmitted from one component to another. For example, processors transmit signals to associated memory devices to read and write data. As the size of these electronic devices becomes smaller, the magnitude of the electrical signals they use also decreases. This decrease is not only due to the inability of smaller electronic structures to handle large electrical signals, but also due to the desire to produce electronic components that consume less power and generate less heat.

The signals from one electrical component to another are typically digital signals, in that they indicate a "logical 0" state or a "logical 1" state. The "logical 0" state is usually a zero voltage state, and the "logical 1" state is a steady voltage state. In transitioning from the zero voltage state to the steady voltage state, the voltage and current may oscillate at levels above and below the steady voltage state until a constant steady voltage state is achieved. One issue faced by the designers of the electronic systems is protecting the various components from damage as a result if peaks in the oscillations of the overvoltage or over-current situations.

Historically, memory devices have used a voltage clamp between the input pad of the device and the internal circuitry to prevent the over-current or over-voltage situation from damaging the memory device. Generally, the voltage clamp includes a pair of MOSFET diode connected transistors in series. A limitation with the MOSFET diode-connected transistors is that the forward bias current handling capacity is limited by a squared function. As technology advances, it is generally desirable to scale down the size of all transistors on an integrated circuit, because such scaling simplifies the design process, saves valuable chip space, and facilitates efficient manufacturing.

However, the current handling capacity of the smaller MOSFET diode-connected transistors raises some concerns for designers. While the larger MOSFET diode-connected transistors are able to handle the over-voltages and over-currents of the input signals, the smaller MOSFET diode-connected transistors may be unable to do so. In other words, the reduction in the size of the MOSFET diode-connected transistors limits their effectiveness in a voltage clamp. As a result, the MOSFET diode-connected transistors used in voltage clamps remain relatively large and cannot be scaled down with the other transistors in the memory device.

Diodes may be used in place of MOSFET diode-connected transistors because diodes exhibit a greater current carrying capacity for a given size. To manufacture these diodes, a fabrication process typically uses a P well or an N well in conjunction with an N+ doped silicon or P+ doped silicon, respectively. Generally, the interface between the doped region and the well covers a large surface area and is not optimally defined. Also, the P well or the N well may not be adequately isolated. If a well is not adequately isolated, then too many carriers may be injected into the substrate and degrade performance. With the current flow above the specified parameters for a circuit, a state of latch-up may occur. Once latch-up occurs, the circuit output may become fixed and not react to input signals.

BRIEF DESCRIPTION OF THE DRAWINGS

Advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
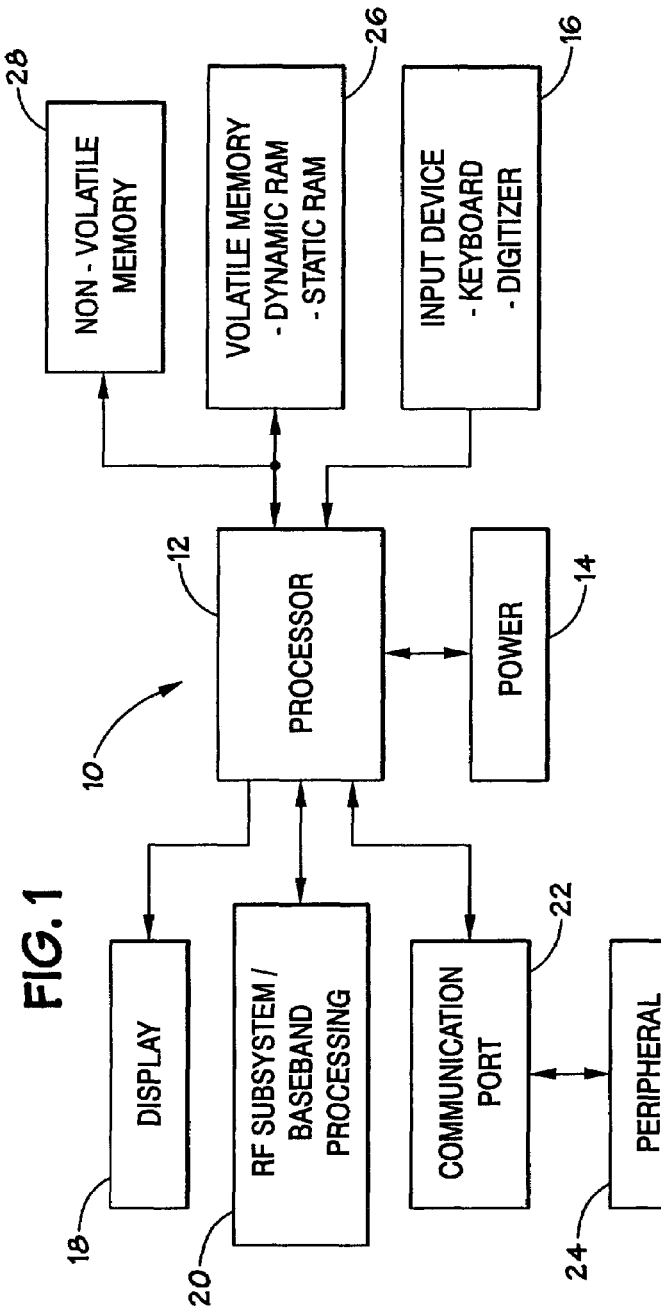
FIG. 1 illustrates a block diagram of an exemplary processor-based device in accordance with the present techniques.

Turning now to the drawings, and referring initially to FIG. 1, a block diagram depicting an exemplary processor-based system, generally designated by reference numeral 10, is illustrated. The system 10 may be any of a variety of types such as a computer, pager, cellular phone, personal organizer, control circuit, etc. In a typical processor-based device, a processor 12, such as a microprocessor, controls the processing of system functions and requests in the system 10. Further, the processor 12 may comprise a plurality of processors, which share system control.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example.

Furthermore, an RF sub-system/baseband processor 20 may also be couple to the processor 12. The RF sub-system/baseband processor 20 may include an antenna that is coupled to an RF receiver and to an RF transmitter (not shown). A communications port 22 may also be coupled to the processor 12. The communications port 22 may be adapted to be coupled to one or more peripheral devices 24 such as a modem, a printer, a computer, or to a network, such as a local area network, remote area network, intranet, or the Internet, for instance.

Because the processor 12 controls the functioning of the system 10 by implementing software programs, memory is used to enable the processor 12 to be efficient. Generally, the memory is coupled to the processor 12 to store and facilitate execution of various programs. For instance, the processor 12 may be coupled to the volatile memory 26 which may include Dynamic Random Access Memory (DRAM) and/or Static Random Access Memory (SRAM). The processor 12 may also be coupled to nonvolatile memory 28. The nonvolatile memory 28 may include a read-only memory (ROM), such as an EPROM, and/or flash memory to be used in conjunction with the volatile memory. The size of the ROM is typically selected to be just large enough to store any necessary operating system, application programs, and fixed data. The volatile memory 26 on the other hand, is typically quite large so that it can store dynamically loaded applications and data. Additionally, the non-volatile memory 28 may include a high capacity memory such as a tape or disk drive memory.

Figure 2:
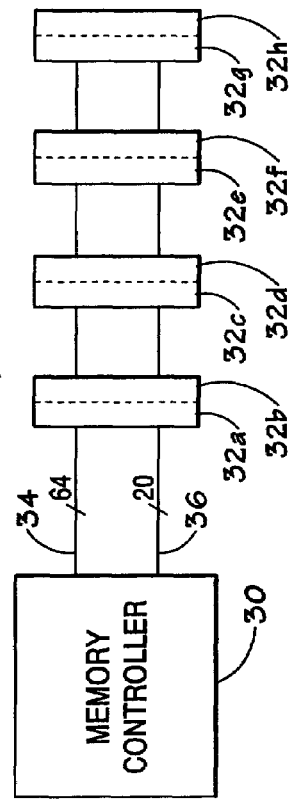
FIG. 2 illustrates an exemplary memory sub-system in accordance with the present techniques.

A portion of a memory sub-system, such as the volatile memory 26, is depicted in FIG. 2. Generally, a memory controller 30 is generally provided to facilitate access to the storage devices. While the present embodiment illustrates the memory controller 30 as existing in the memory sub-system, the memory controller 30 may be in the processor 12 or may exist in a completely separate chip, as can be appreciated by those skilled in the art. The memory controller 30 may receive requests to access the memory devices via one or more processors, such as the processor 12, via peripheral devices, such as the peripheral device 24, and/or via other systems. As previously discussed, the memory controller 30 is generallytasked with facilitating the execution of the requests to the memory devices and coordinating the exchange of information, including configuration information, to and from the memory devices.

The memory sub-system may include a plurality of slots or ranks 32A-32H, which are configured to operably couple a memory module, such as a dual-inline memory module (DIMM), to the memory controller 30 via one or more memory buses. Each DIMM generally includes a plurality of memory devices such as dynamic random access memory (DRAM) devices capable of storing data. The memory buses may include a memory data bus 34 to facilitate the exchange of data between each memory device and the memory controller 30. The memory data bus 34 may actually comprise a plurality of single bit data buses each coupled from the memory controller 30 to an individual memory device. In one embodiment of the volatile memory 26, the memory data bus 34 may include 64 individual data buses. In this embodiment, each of the eight memory ranks 32A-32H is capable of supporting a module comprising eight individual memory devices. As can be appreciated by those skilled in the art, the individual buses in the memory data bus 34 will vary depending on the configuration and capabilities of the system 10.

The volatile memory 26 may also include a command bus 36 on which address information such as command address (CA), row address select (RAS), column address select (CAS), write enable (WE), bank address (BA), and chip select (CS), for example, may be delivered for a corresponding request. As with the memory data bus 34, the command bus 36 may actually comprise a plurality of individual command buses. A single command bus may be provided for each corresponding memory device on each corresponding memory module. In the present embodiment, the command bus may include 20 individual buses.

The memory devices within the slots or ranks 32A-32H may include a plurality of static random access memories, dynamic random access memories, read only memory, or nonvolatile programmable memory. As with most integrated circuits, memory devices include conductive members, such as pads, to allow electrical signals to pass to and from the chip. In other words, the pads couple received signals to the internal circuitry of the chip and transmit signals generated by the internal circuitry to other external electronic components. The internal circuitry of the typical integrated circuit, such as a memory chip, relies on signals received from other devices to perform certain functions. While the current and voltage levels of such signals are generally defined by the system design, variations to the defined levels do occur.

To protect the internal circuitry from possibly damaging over-voltage or over-current situations, chips are often designed to include a voltage clamp coupled between other internal circuitry and each input pad. As described previously, such voltage clamps are typically fabricated as a pair of MOSFET diode-connected transistors connected in series, with the pad and internal circuitry connected between the MOSFET diode-connected transistors. However, with the trend to decrease the size of the MOSFET diode-connected transistors, the effectiveness of these voltage clamps is a concern. The focus of the concern is on the diminished current handling capacity that results from the decrease in size of the MOSFET diode-connected transistor. If the scaled MOSFET diode-connected transistors are unable to handle the over-current or over-voltage situation for a given input signal, designers may use larger MOSFET diode-connected transistors to ensure that such situations are properly handled.

Figure 3:
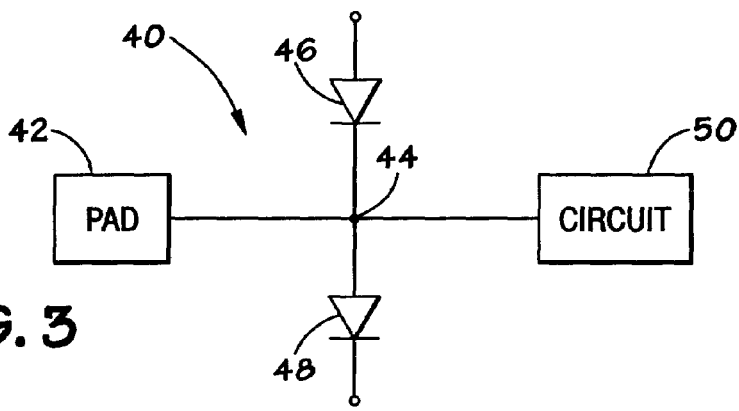
FIG. 3 illustrates a schematic diagram of a PN diode voltage clamp in accordance with the present techniques.

To address this concern, a voltage clamp 40 comprised of two PN junction diodes 46 and 48, as depicted in FIG. 3, may be used. Unlike previous PN junction diode voltage clamps, which produce undesirable substrate leakage, the present voltage clamp 40 includes diodes 46 and 48 that are structured to reduce or eliminate such substrate leakage. Various exemplary embodiments for such PN junction diodes are described below with reference to FIGS. 7-11. Thus, the voltage clamp 40 provides the better current-carrying capabilities of diodes versus diode-connected transistors, along with substantially reduced substrate leakage as compared with traditional diodes.

The voltage clamp 40 depicted in FIG. 3 is located on an integrated circuit chip and electrically coupled to a pad 42 on the chip that is capable of receiving an input signal from an outside source. As mentioned previously, the pad 42 may also be a pin, a socket, a ball, or any metal or conductive material capable of receiving and transferring electrical signals to the integrated circuit. The first diode 46 and the second diode 48 of the voltage clamp 40 are connected in series as shown to form a first node 44 therebetween. The node 44 of the voltage clamp 40 is coupled between the pad 42 and other internal circuitry 50 on the chip. With respect to the first diode 46 and the second diode 48, each have an anode and a cathode, respectively. The anode of the first diode 46 may be connected to a ground or circuitry that is at a lower potential voltage. The cathode of the first diode 46 is connected to the anode of the second diode 48 through the first node 44. The cathode of second diode 48 is connected to a voltage source or other circuitry that is at a higher potential voltage.

Figure 4:
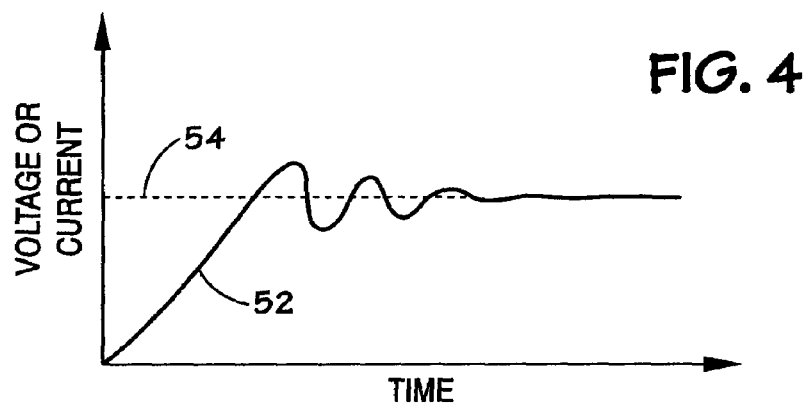
FIG. 4 illustrates a graph of the magnitude of an input signal v. time.

To illustrate the desired effect of the voltage clamp 40, FIG. 4 is a graph of signal magnitude verses time for a typical input signal 52 that may be received on the pad 42. The input signal 52 typically is a logical signal that starts from a low logical state, i.e. zero voltage, and progresses rapidly to a steady state level 54 or high logical state. However, the input signal 52 may not make a smooth transition from a low logical state to the steady state level 54. Rather, the input signal 52 may oscillate above and below the steady state level 54. The initial spikes and valleys from the oscillations are depicted on the input signal 52. The spikes are potentially damaging to the circuit 50 and the voltage clamp 40 is used to minimize the oscillation.

Figure 5:
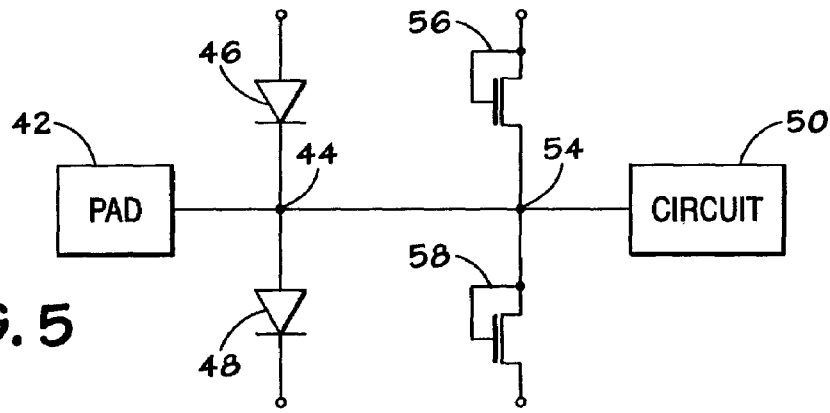
FIG. 5 illustrates a schematic diagram of a PN diode and MOSFET diode-connected transistor voltage clamp in accordance with the present techniques.

In another possible embodiment, a voltage clamp 52 may include a pair of PN diodes 46 and 48 in parallel with a pair of MOSFET diode-connected transistors 56 and 58 as depicted in FIG. 5. In FIG. 5, the input signal from an external device is transmitted to the pad 42. The pad 42 is connected between the first diode 46 and the second diode 48 at the first node 44, as described previously with reference to FIG. 3. In addition, a second voltage clamp is essentially formed by a first MOSFET diode-connected transistor 56 and a second MOSFET diode-connected transistor 58. The junction of the transistors 56 and 58 forms a second node 54 at the first node 44. The source and the gate of the first MOSFET diode connected transistor 56 are connected to a ground or circuit of lower voltage potential. The drain of the first MOSFET diode-connected transistor 56 is connected to the source and gate of the second MOSFET diode-connected transistor 58 at the second node 54. The drain of the second MOSFET diode-connected transistor 58 is connected to a voltage source or a circuit of higher voltage potential. The nodes 44 and 54 of the voltage clamp 52 are coupled between the pad 42 and other internal circuitry 50 on the chip.

Figure 6:
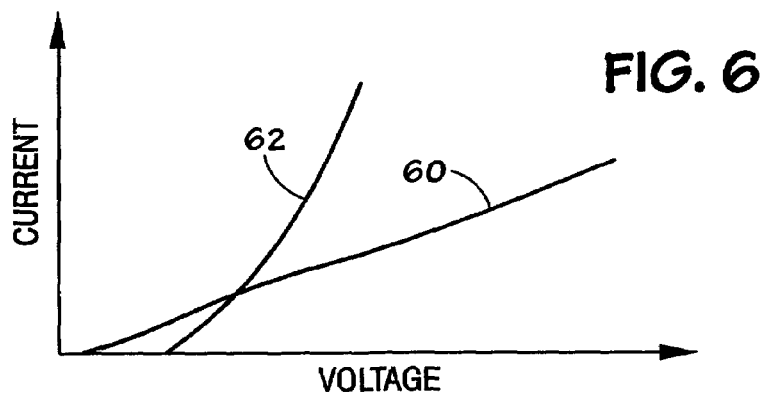
FIG. 6 illustrates a graph of diode and transistor responses to current v. voltage.

To explain the enhanced characteristics of the voltage clamp 52, FIG. 6 shows a graph of current v. voltage for a typical PN diode and a typical MOSFET diode-connected transistor. The MOSFET diode-connected transistor signal 60 is shown as having a more linear increase in current as the voltage increases. In contrast, the PN diode signal 62 exhibits a more dramatic exponential increase of current at a lower voltage, which indicates a capacity for a PN diode to carry higher amounts of current at a lower voltage. However, it should be noted that the transistor responds at a lower threshold voltage than the diode. Thus, the combination of the MOSFET diode-connected transistor clamp and the PN diode clamp illustrated in FIG. 5 provides the benefits of each type of clamp. The use of the MOSFET diode-connected transistors 56 and 58 provides a quicker response to lower voltages, and the use of the PN diode 46 and 48 provides a larger current carrying capacity at lower voltages. By using this combination, the voltage clamp 52 is able to handle the large amount of current and still retain the responsiveness found in a conventional MOSFET diode-connected transistor clamp.

Figure 7:
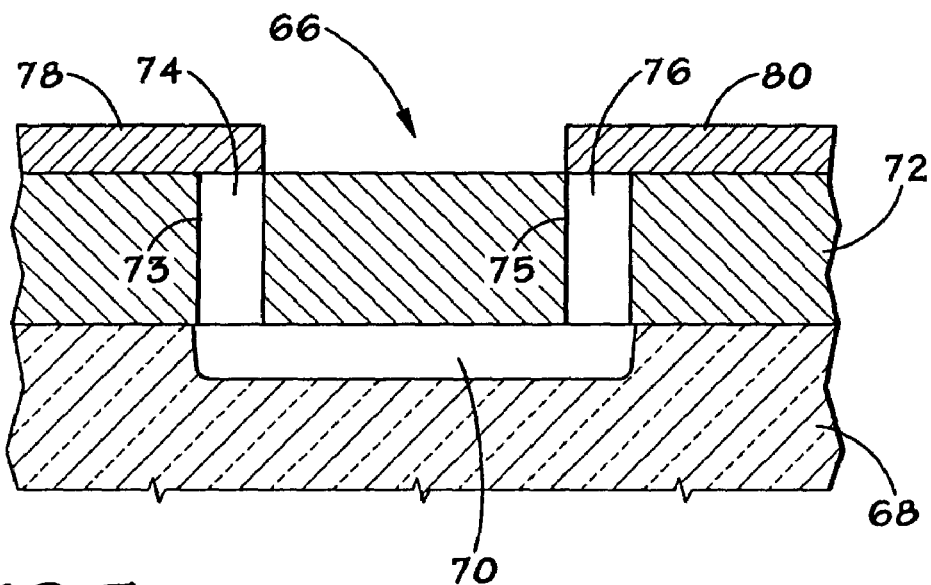
FIG. 7 illustrates a cross sectional view of one embodiment of a PN diode in accordance with the present techniques.

A first embodiment of a PN diode 66 that may be used in the voltage clamps 40 or 52 is shown in FIG. 7. The PN diode 66 is formed in a substrate 68 which may be a P-doped or N-doped material. In the substrate 68, a doped region 70 may be a portion of the substrate 68 or a separate channel containing a different material than the substrate 68. Next, a dielectric material 72 is disposed over the substrate 68. Within the dielectric material 72, a first hole 73 and a second hole 75 are formed using conventional techniques. These conventional techniques may be a wet etching process, a dry etching process, or other suitable process. Once the holes 73 and 75 are formed, the first hole 73 is filled with a first polysilicon plug 74 and the second hole 75 is filled with a second polysilicon plug 76. The first polysilicon plug 74 and second polysilicon plug 76 may be a N-doped or P-doped polysilicon. A first conductive material 78 is deposited in contact with the first polysilicon plug 74, and a second conductive material 80 is deposited in contact with the second polysilicon plug 80. The first conductive material 78 and the second conductive material 80 may be a metal or any other conductive material. Furthermore, a thin layer of diffusion resistant material may be implanted between the doped region 70 and the first polysilicon plug 74 or between the doped region 70 and the second polysilicon plug 76 to reduce diffusion.

A more specific example of the first embodiment may have the substrate as a bulk P– with the doped region 70 being N+ doped silicon. Likewise, the first polysilicon plug 74 may be a N+ doped polysilicon plug and the second polysilicon plug 76 may be a P+ doped polysilicon plug. Similarly, the first conductive material 78 and second conductive material 80 may be tungsten. Arsenic may be the thin layer of diffusion resistant material that is implanted between the doped region 70 and the polysilicon plugs 74 and 76. In this embodiment, a PN diode is formed between the second polysilicon plug 76 and the doped region 70, which has a small interface between the two regions. The current or carriers in a typical diode will have some portion that is injected into the substrate. By having a small interface between regions, the amount of current or carriers being injected into the substrate 68 is significantly reduced. In addition to being more efficient, the present embodied diode requires less space than other conventional diodes. This reduction in spacing is done by isolating the diode from the substrate 68 since it is disposed over the doped region 70. Moreover, this isolation reduces the need for greater spacing between structures on the substrate 68. The isolation of the diode allows structures to be formed in a closer proximity by limiting the current injected into the substrate 68.

Another example of the first embodiment may have the substrate as a bulk N− with the doped region 70 being P+ doped silicon. Likewise, the first polysilicon plug 74 may be a N+ doped polysilicon plug and the second polysilicon plug 76 may be a P+ doped polysilicon plug. Similarly, the first conductive material 78 and the second conductive material 80 may be tungsten. Arsenic may be the thin layer of diffusion resistant material that is implanted between the doped region 70 and the polysilicon plugs 74 and 76. In this embodiment, a PN diode is formed between the first polysilicon plug 74 and the doped region 70, which has a small interface between the two regions. The current or carriers in a typical diode will have some portion that is injected into the substrate. By having a small interface between regions, the amount of current or carriers being injected into the substrate 68 is significantly reduced. In addition to being more efficient, the diode requires less space than other conventional diodes. The reduction in spacing is done by isolating the diode from the substrate 68 since it is disposed over the doped region 70. Moreover, this isolation reduces the need for greater spacing between structures within the substrate 68. The isolation of the diode allows structures to be formed in a closer proximity by limiting the current injected into the substrate 68.

Figure 8:
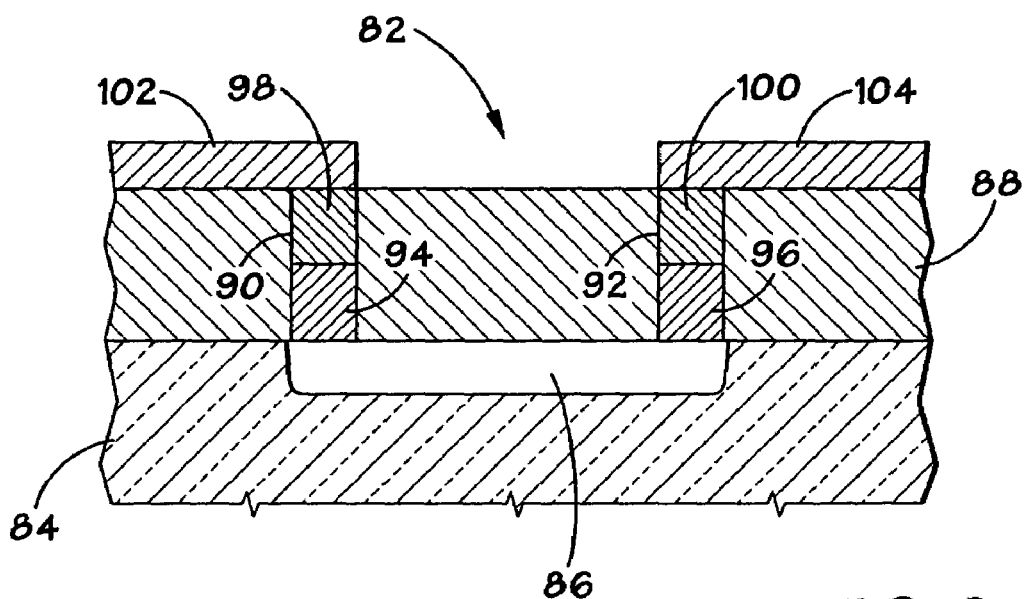
FIG. 8 illustrates a cross sectional view of a first alternative embodiment of a PN diode in accordance with the present techniques.

A second possible embodiment of a PN diode 82 that may be used in the voltage clamps 40 or 52 is shown in FIG. 8. The PN diode 82 is formed in a substrate 84 which may be a P-doped or N-doped material. In the substrate 84, a doped region 86 may be a portion of the substrate 84 or a separate channel containing a different material than the substrate 84. Next, a dielectric material 88 is disposed over the substrate 82 and the doped region 86. Within the dielectric material 88, a first hole 90 and a second hole 92 are formed using conventional techniques. These conventional techniques may be a wet etching process, a dry etching process, or other suitable process. Once the holes 90 and 92 are formed, the first hole 90 is filled with a first polysilicon plug 94 and the second hole 92 is filled with a second polysilicon plug 96. The first polysilicon plug 94 and the second polysilicon plug 96 may be a N-doped or P-doped polysilicon. A first conductive material 98 is deposited in contact with the first polysilicon plug 94, and a second conductive material 100 is deposited in contact with the second polysilicon plug 96. The first conductive material 98 and the second conductive material 100 may be a metal or any other conductive material. Disposed over the first conductive material 98 and the dielectric material 88 is a third conductive member 102. Similarly, a fourth conductive material 104 is disposed over the second conductive material 100 and the dielectric material 88. Furthermore, a thin layer of diffusion resistant material may be implanted between the doped region 86 and the first polysilicon plug 94 or between the doped region 70 and the second polysilicon plug 96 to reduce diffusion.

A more specific example of the second embodiment may have the substrate as a bulk P− with the doped region 86 being N+ doped silicon. Likewise, the first polysilicon plug 94 may be a N+ doped polysilicon plug and the second polysilicon plug 96 may be a P+ doped polysilicon plug. Similarly, the first conductive material 98, the second conductive material 100, the third conductive material 102, and the fourth conductive material 104 may be tungsten. Arsenic may be the thin layer of diffusion resistant material that is implanted between the doped region 86 and the polysilicon plugs 94 and 96. In this embodiment, the PN diode is formed between the second polysilicon plug 96 and the doped region 86, which has a small interface between the two regions. The current or carriers in a typical diode will have some portion that is injected into the substrate. By having a small interface between regions, the amount of current or carriers being injected into the substrate 84 is significantly reduced. In addition to being more efficient, the diode requires less space than other conventional diodes. The reduction in spacing is done by isolating the diode from the substrate 84 to the doped region 86. Moreover, this isolation reduces the need for greater spacing between structures within the substrate 84. The isolation of the diode allows structures to be formed in a closer proximity by limiting the current injected into the substrate 84.

Another example of the second embodiment may have the substrate as a bulk N− with the doped region 86 being P+ doped silicon. Likewise, the first polysilicon plug 94 may be a N+ doped polysilicon plug and the second polysilicon plug 96 may be a P+ doped polysilicon plug. Similarly, the first conductive material 98, the second conductive material 100, the third conductive material 102, and the fourth conductive material 104 may be tungsten. Arsenic may be the thin layer of diffusion resistant material that is implanted between the doped region 86 and the polysilicon plugs 94 and 96. In this embodiment, a PN diode is formed between the first polysilicon plug 94 and the doped region 86, which has a small interface between the two regions. The current or carriers in a typical diode will have some portion that is injected into the substrate. By having a small interface between regions, the amount of current or carriers being injected into the substrate 84 is significantly reduced. In addition to being more efficient, the diode requires less space than other conventional diodes.

The reduction in spacing is done by isolating the diode from the substrate 84 to the doped region 86. Moreover, this isolation reduces the need for greater spacing between structures within the substrate 84. The isolation of the diode allows structures to be formed in a closer proximity by limiting the current injected into the substrate 84.

Figure 9:
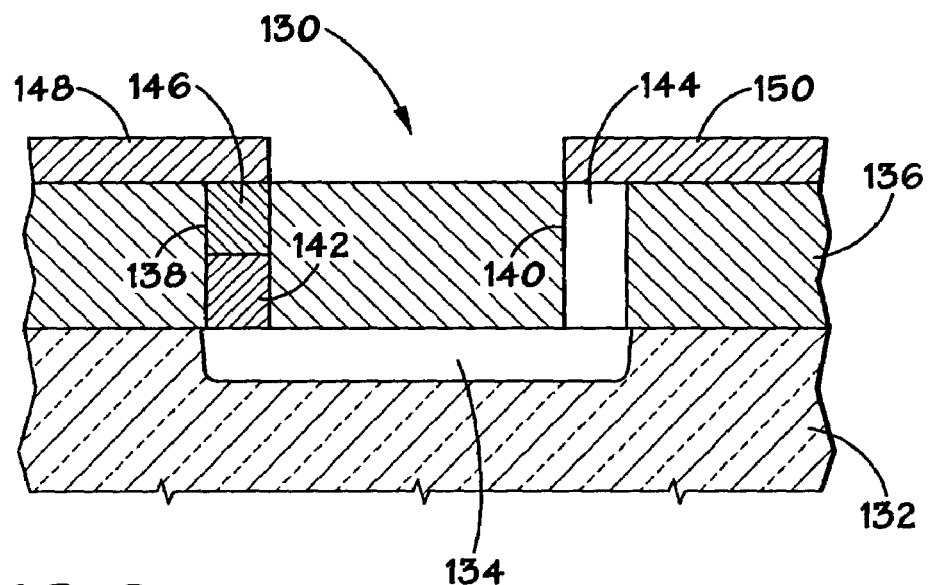
FIG. 9 illustrates a cross sectional view of a second alternative embodiment of a PN diode in accordance with the present techniques.

A third possible embodiment of a PN diode 130 that may be used in the voltage clamps 40 or 52 is shown in FIG. 9. The PN diode 130 is formed in a substrate 132 which may be a P-doped or N-doped material. In the substrate 132, a doped region 134 may be a portion of the substrate 132 or a separate channel containing a different material than the substrate 132. Next, a dielectric material 136 is disposed over the substrate 132 and the doped region 134. Within the dielectric material 136, a first hole 138 and a second hole 140 are formed using conventional techniques. These conventional techniques may be a wet etching process, a dry etching process, or other suitable process. Once the holes 138 and 140 are formed, the first hole 138 is filled with a first polysilicon plug 142 and the second hole 140 is filled with a first conductive material 144. The first polysilicon plug 142 may be a N-doped or P-doped polysilicon. A second conductive material 146 is deposited in contact with the first polysilicon plug 142. A third conductive material 148 is deposited in contact with the second conductive material 146 and disposed over the dielectric material 136. Disposed over the first conductive material 162 and the dielectric material 136 is a fourth conductive material 150. The first conductive material 144, the second conductive material 146, the third conductive material 148, and the fourth conductive material 150 may be a metal or any other conductive material. Furthermore, a thin layer of a diffusion resistant material may be implanted between the doped region 134 and the first polysilicon plug 142 to reduce diffusion.

A more specifically example of the third embodiment may have the substrate as a bulk N− with the doped region 134 being a P+ doped silicon. Likewise, the first polysilicon plug 142 may be a N+ doped polysilicon plug. Similarly, the first conductive material 144, the second conductive material 146, the third conductive material 148, and the fourth conductive material 150 may be tungsten. Arsenic may be the thin layer of diffusion resistant material that is implanted between the doped region 134 and the first polysilicon plugs 142. In this embodiment, the PN diode is formed between the first polysilicon plug 142 and the doped region 134, which has a small interface between the two regions. The current or carriers in a typical diode will have some portion that is injected into the substrate. By having a small interface between regions, the amount of current or carriers being injected into the substrate 132 is significantly reduced. In addition to being more efficient, the diode requires less space than other conventional diodes. The reduction in spacing is done by isolating the diode from the substrate 132 to the doped region 134. Accordingly, this isolation reduces the need for greater spacing between structures within the substrate 132. The isolation of the diode allows structures to be formed in a closer proximity by limiting the current injected into the substrate 132.

An alternative example of the third embodiment may have the substrate as a bulk P− with the doped region 134 being a N+ doped silicon. Likewise, the first polysilicon plug 142 may be a P+ doped polysilicon plug. Similarly, the first conductive material 144, the second conductive material 146, the third conductive material 148, and the fourth conductive material 150 may be tungsten. Arsenic may be the thin layer of diffusion resistant material that is implanted between the doped region 134 and the first polysilicon plugs 142. In this embodiment, PN diode is formed between the first polysilicon plug 142 and the doped region 134, which has a small interface between the two regions. The current or carriers in a typical diode will have some portion that is injected into the substrate. By having a small interface between regions, the amount of current or carriers being injected into the substrate 132 is significantly reduced. In addition to being more efficient, the diode requires less space than other conventional diodes. The reduction in spacing is done by isolating the diode from the substrate 132 to the doped region 134. Moreover, this isolation reduces the need for greater spacing between structures within the substrate 132. The isolation of the diode allows structures to be formed in a closer proximity by limiting the current injected into the substrate 132.

Figure 10:
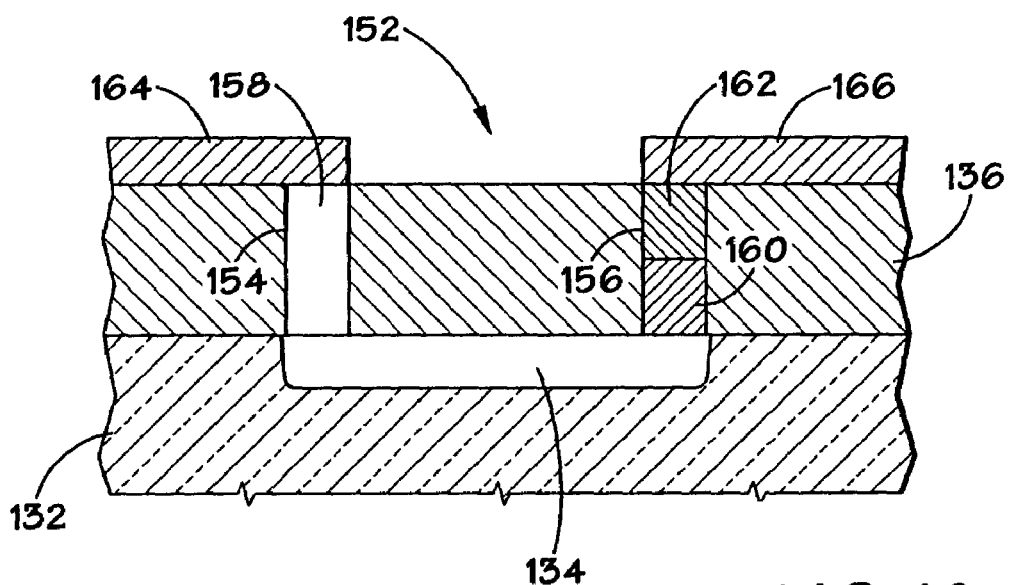
FIG. 10 illustrates a cross sectional view of a third alternative embodiment of a PN diode in accordance with the present techniques.

A fourth possible embodiment of a PN diode 152 that may be used in the voltage clamps 40 or 52 is shown in FIG. 10. The PN diode 152 is formed in a substrate 132 which may be a P-doped or N-doped material. In the substrate 132, a doped region 134 may be a portion of the substrate 132 or a separate channel containing a different material than the substrate 132. Next, a dielectric material 136 is disposed over the substrate 132 and the doped region 134. Within the dielectric material 136, a first hole 154 and a second hole 156 are formed using conventional techniques. These conventional techniques may be a wet etching process, a dry etching process, or other suitable process. Once the holes 154 and 156 are formed, the first hole 154 is filled with a first conductive material 158 and the second hole 156 is filled with a first polysilicon plug 160. The first polysilicon plug 160 may be a N-doped or P-doped polysilicon. A second conductive material 164 is deposited in contact with the first conductive material 158, and a third conductive material 162 is deposited in contact with the first polysilicon plug 160. Disposed over the third conductive material 162 and the dielectric material 136 is a fourth conductive material 168. The first conductive material 158, the second conductive material 164, the third conductive material 162, and the fourth conductive material 168 may be a metal or any other conductive material. Furthermore, a thin layer of a diffusion resistant material may be implanted between the doped region 134 and the first polysilicon plug 160 to reduce diffusion.

A more specific example of the fourth embodiment may have the substrate as a bulk P− with the doped region 134 being N+ doped silicon. Likewise, the first polysilicon plug 160 may be a P+ doped polysilicon plug. Similarly, the first conductive material 158, the second conductive material 164, the third conductive material 162, and the fourth conductive material 168 may be tungsten. Arsenic may be the thin layer of diffusion resistantmaterial that is implanted between the doped region 134 and the first polysilicon plugs 160. In this embodiment, the PN diode is formed between the first polysilicon plug 160 and the doped region 134, which has a small interface between the two regions. The current or carriers in a typical diode will have some portion that is injected into the substrate. By having a small interface between regions, the amount of current or carriers being injected into the substrate 132 is significantly reduced. In addition to being more efficient, the diode requires less space than other conventional diodes. The reduction in spacing is done by isolating the diode from the substrate 132 to the doped region 134. Moreover, this isolation reduces the need for greater spacing between structures within the substrate 132. The isolation of the diode allows structures to be formed in a closer proximity by limiting the current injected into the substrate 132.

An alternative example of the fourth embodiment may have the substrate as a bulk N− material with the doped region 134 being P+ doped silicon. Likewise, the first polysilicon plug 160 may be a N+ doped polysilicon plug. Similarly, the first conductive material 158, the second conductive material 164, the third conductive material 162, and the fourth conductive material 168 may be tungsten. Arsenic may be the thin layer of diffusion resistant material that is implanted between the doped region 134 and the first polysilicon plugs 160. In this embodiment, the PN diode is formed between the first polysilicon plug 160 and the doped region 134, which has a small interface between the two regions. The current or carriers in a typical diode will have some portion that is injected into the substrate. By having a small interface between regions, the amount of current or carriers being injected into the substrate 132 is significantly reduced. In addition to being more efficient, the diode requires less space than other conventional diodes. The reduction in spacing is done by isolating the diode from the substrate 132 to the doped region 134. Moreover, this isolation reduces the need for greater spacing between structures within the substrate 132. The isolation of the diode allows structures to be formed in a closer proximity by limiting the current injected into the substrate 132.

Figure 11:
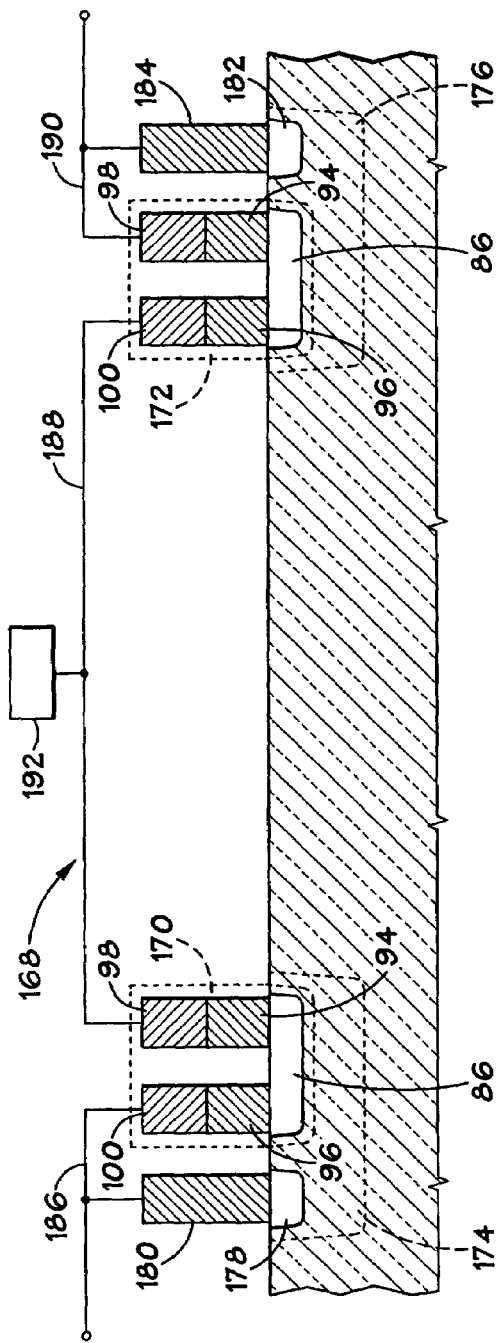
FIG. 11 illustrates a cross sectional view of a PN diode voltage clamp in accordance with FIGS. 3 and 8.

As one embodiment of the voltage clamp 40 or 52, a pair of PN diodes may be connected in series to form a voltage clamp 168 as shown in FIG. 11. The voltage clamp 168 may include a first diode 170 and a second diode 172, which may correspond to the diodes 46 and 48 as depicted in FIG. 3. For instance, the first diode 170 and the second diode 172 may include a cathode, which includes regions 94 and 98, and an anode, which includes regions 96 and 100, as discussed above with regard to FIG. 8. The diodes 170 and 172 are formed in a first substrate 174 and a second substrate 176, which may be a P-doped or N-doped material.

In the first substrate 174, the first diode 170 may be formed as described in FIGS. 8-10. Also, a first doped region 178 may be formed adjacent to the first diode 170, in a portion of the substrate 174, or a separate channel containing the same material as the first substrate 174. The first doped region 178 may be doped lighter or more doped heavier than the first substrate 174. Furthermore, disposed over the first doped region 178 may be a first tie down 180. The first tie down 180 may be a lightly doped region that includes the same material as the first doped region 178 or a conducting material.

Similarly, in the second substrate 176, a second diode 172 may be formed as described in FIGS. 8-10. Likewise, a second doped region 182 may be formed adjacent to the second diode, which may be a portion of the second substrate 176 or a separate channel containing the same material as the second substrate 176. The material in the second doped region 182 may be doped lighter or doped heavier than the second substrate 176. Furthermore, disposed over the second doped region 182 may be a second tie down 184. The second tie down 184 may be a lightly doped region that includes the same material as the second doped region 182.

A first conductive link 186 may be disposed over the anode of the first diode 170 and the first tie down 180 to connect these components to a ground or source of lower voltage potential. A second conductive link 188 may be disposed over the cathode of the first diode 170, which connects the cathode of the first diode 170 to the pad 42 and the anode of the second diode 172. A third conductive link 190 may be disposed over the cathode of the second diode 172 and the second tie down 184, which may be connected to a voltage source or circuit of higher voltage potential. The conductive links 186, 188, and 190 may correspond to the conductive materials 102 and 104 discussed in FIG. 8.

As a specific example of the embodiment, the substrate 174 may be a bulk N− material with the doped region 86 being P+ doped silicon. Likewise, the first polysilicon plug 94 may be a N+ doped polysilicon plug and the second polysilicon plug 96 may be a P+ doped polysilicon plug. The first doped region 178 and the second doped region 182 may be N+ doped polysilicon, while the first tie down 180 and the second tie down 184 may be N− doped polysilicon. Similarly, the first conductive material 98, the second conductive material 100, the first conductive link 186, the second conductive link 188, and the third conductive link 190 may be tungsten. Arsenic may be the thin layer of diffusion resistant material that is implanted between the doped region 178 and 182 and the tie downs 180 and 184.

In this embodiment, a first tie down 180 and the second tie down 184 maintain the potential of the first substrate 174 and the second substrate 176, respectively. The current or carriers in a typical diode may have some portion that is injected into the substrate. By having a small interface between regions, the amount of current or carriers being injected into the substrates 174 and 176 may be significantly reduced. In addition to being more efficient, the diode also requires less space than other conventional diodes. The reduction in spacing is done by isolating the diode from the substrates 174 and 176 to the doped regions 86 of each diode 170 and 172. Moreover, this isolation reduces the need for greater spacing between structures within the substrates 174 and 176. Thus, the isolation of the diode allows structures to be formed in a closer proximity by limiting the current injected into the substrates 174 and 176. Accordingly, different modifications may be made for various other embodiments.

Figure 12:
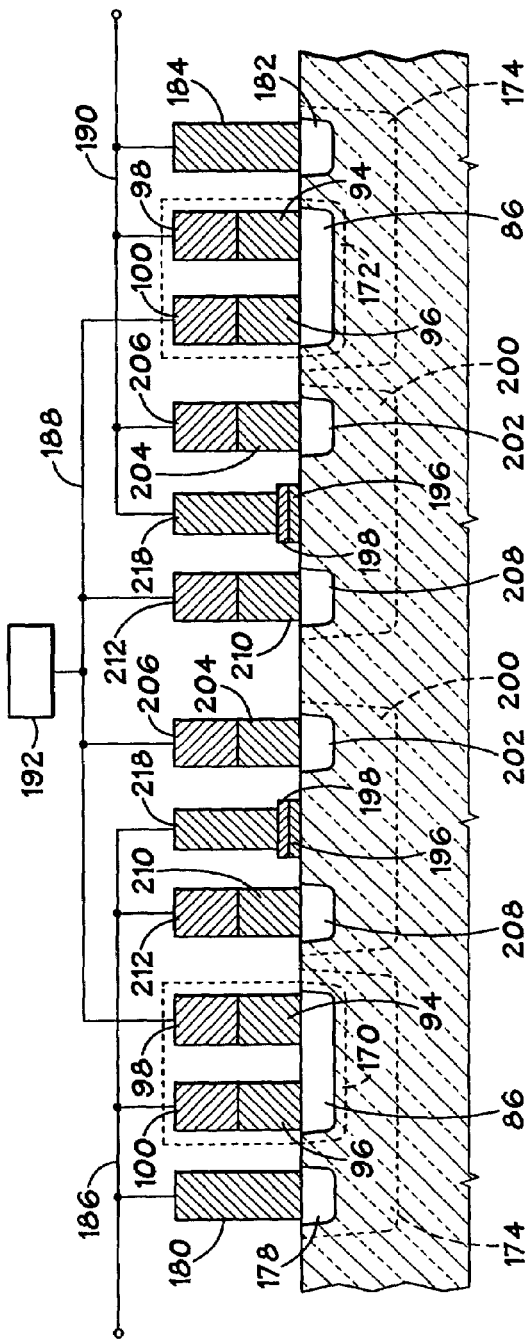
FIG. 12 illustrates a cross sectional view of a PN diode and MOSFET diode-connected transistor voltage clamp in accordance with FIGS. 5 and 8.

As an alternative embodiment of the voltage clamp 52, FIG. 12 depicts a pair of PN diodes that may be connected in parallel with a pair of MOSFET diode-connected transistors 56 and 58 to form a voltage clamp 194. The pad 192 is connected between the first diode 170 and the second diode 172, as described previously with reference to FIG. 11. In addition, a first MOSFET diode-connected transistor 196 and a second MOSFET diode-connected transistor 198 essentially form a second voltage clamp, which corresponds to the MOSFET diode-connected transistors 56 and 58 as depicted in FIG. 5.

For example, each of the MOSFET diode-connected transistors 196 and 198 may be formed in a third substrate 200. The MOSFET diode-connected transistors 196 and 198 may each include a drain, a source, and a gate. The drain may include a drain doped region 202, which may be a P-doped or N-doped material. Disposed over the doped drain regions 202 may be a drain polysilicon plug 204, which may be a material doped opposite of the doped drain region 202. Then, a drain conductive layer 206 may be disposed over the drain polysilicon plug 204. The source may be formed in a similar method with a source doped region 208, a source polysilicon plug 210 disposed over the source doped region 208, and a source conductive layer 212 disposed over the source polysilicon plug 210. Furthermore, the gate may be formed by disposing a first gate layer 214 over the third substrate 200. The first gate layer 214 may be a doped channel or a poly silicon layer. Disposed over the first gate layer 214 may be a second gate layer 216, which may be a polysilicon material, and disposed over the second gate layer 216 may be a gate conductive layer 218. Accordingly, alternative embodiments may be implemented depending on the specific requirements.

In this embodiment, the first conductive link 186 may be disposed over the anode of the first diode 170, the first tie down 180, the source conductive layer 212, and the gate conductive layer 218. The first conductive link 186 may connect these components to a ground or source of lower voltage potential. A second conductive link 188 may be disposed over the cathode of the first diode 170, the anode of the second diode 172, the drain conductive layer 206 of the first MOSFET diode-connected transistor 196, and the source conductive layer 212 of the second MOSFET diode-connected transistor 198. This second conductive link 188 connects the first diode 170, the second diode 172, the first MOSFET diode-connected transistor 196, and the second MOSFET diode-connected transistor 198 to the pad 42. A third conductive link 190 may be disposed over the cathode of the second diode 172, the second tie down 184, and the drain conductive layer 206 of the second MOSFET diode-connected transistor 198, which may be connected to a voltage source or circuit of higher voltage potential. The conductive links 186, 188, and 190 may correspond to the conductive materials 102 and 104 discussed in FIG. 8.

As a specific example of the embodiment, the substrate 174 may be a bulk N− material with the doped region 86 being P− doped silicon. Likewise, the first polysilicon plug 94 and the source poly plugs 212 may be a N+ doped polysilicon plug, while the second polysilicon plug 96 and drain polysilicon plugs 204 may be a P+ doped polysilicon plug. The first doped region 178, source doped regions 208, drain doped regions 202, and the second doped region 182 may be N+ doped polysilicon, while the first tie down 180 and the second tie down 184 may be N−doped polysilicon. Similarly, the first conductive material 98, the second conductive material 100, the first conductive link 186, the second conductive link 188, source conductive layer 212, drain conductive layer 206, gate conductive layer 218, and the third conductive link 190 may be tungsten. Arsenic may be the thin layer of diffusion resistant material that is implanted between the doped region 178 and 182 and the tie downs 180 and 184.

In this embodiment, as discussed with FIG. 11, the first tie down 180 and the second tie down 184 maintain the potential of the first substrate 174 and the second substrate 176. The current or carriers in a typical diode may have some portion that is injected into the substrate. By having a small interface between regions, the amount of current or carriers injected into the substrates 174 and 176 may be significantly reduced. In addition to being more efficient, the diode requires less space than other conventional diodes. The reduction in spacing is done by isolating the diode from the substrates 174 and 176 to the doped regions 86 of each diode 170 and 172. Moreover, this isolation reduces the need for greater spacing between structures within the substrates 174 and 176. The isolation of the diode allows structures to be formed in a closer proximity by limiting the current injected into the substrates 174 and 176. Accordingly, different modifications may be made for various other embodiments.

Figure 13:
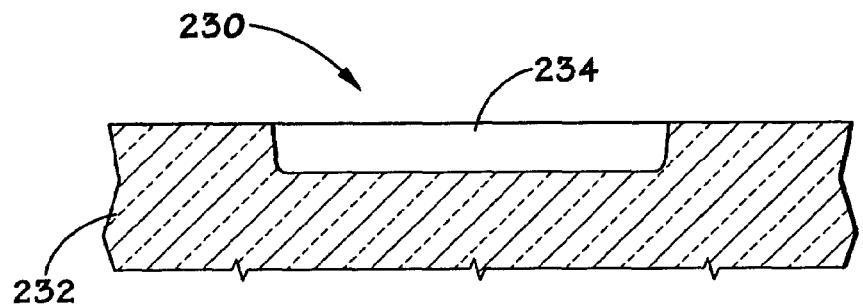
FIGS. 13-18 illustrate cross-sectional views of the PN diode of FIG. 8 during different stages of fabrication.

In turning to a process for developing the PN diode, the process is illustrated in FIGS. 13 through 18. The first step in the process is depicted in FIG. 13. A layered material 230 is depicted in FIG. 13 having a substrate 232 with a doped region 234 covering a portion of the substrate 232. The substrate 232 may be a P− well or a N− well with the doped region 234 being oppositely charged N+ doped silicon or P+ doped silicon. The doped region 234 may be a portion of the substrate 232, a channel, or other material layered on the substrate 232. The doped region 234 may be doped through ion implantation, diffusion, or any other suitable doping method. Likewise, the dopants may be boron, arsenic, phosphorus, or any other similar material used for doping.

Figure 14:
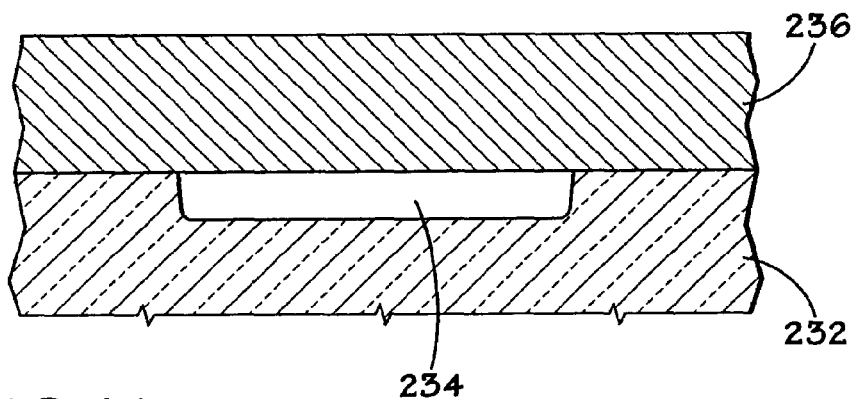
Figure 15:
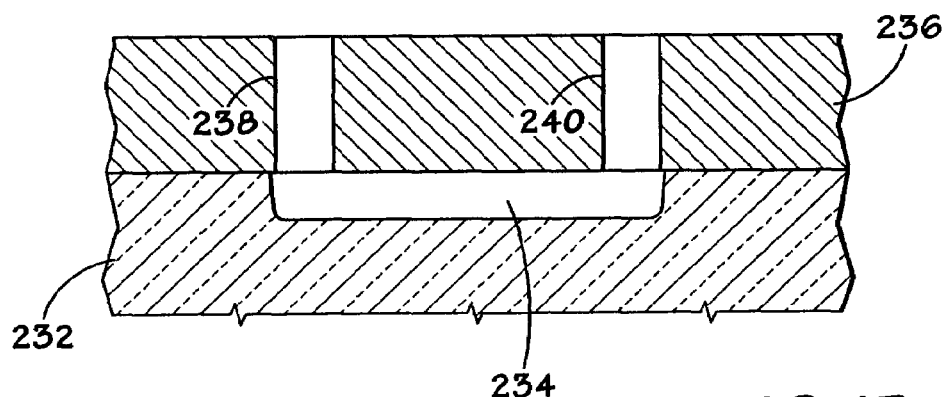

In addition to the substrate 232 and the doped region 234, a dielectric material 236 is disposed over the substrate 232 and the doped region 234 as illustrated in FIG. 14. The dielectric layer 236 may be deposited in a variety of methods including chemical vapor deposition, physical vapor deposition, sputtering, or atomic layer deposition. Furthermore, the dielectric layer 236 may be an oxide, a nitride, a glass, or any other suitable material having dielectric properties. In continuing the process, a first hole 238 and a second hole 240 are removed from the dielectric layer 236 through conventional methods as depicted in FIG. 15. The conventional methods may be a wet etching process, a dry etching process, photolithography, or any other suitable process. The first hole 238 and the second hole 240 penetrate the dielectric material 236 exposing the doped region 234.

Figure 16:
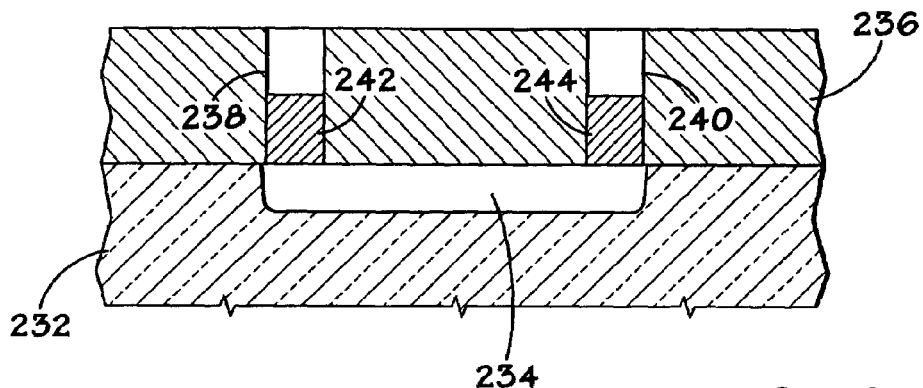
Figure 17:
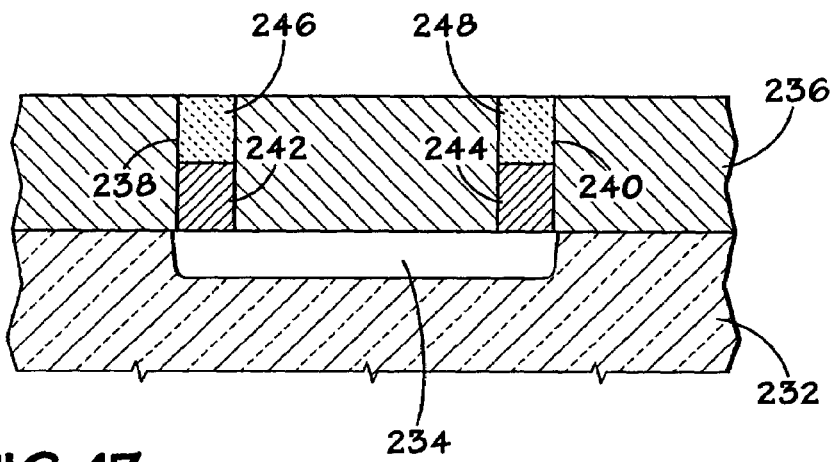

By exposing the doped region 234, the first hole 238 and the second hole 240 enable a first polysilicon plug 242 and a second polysilicon plug 244 to be disposed over the doped region 234 as illustrated in FIG. 16. The first polysilicon plug 242 is deposited in the first hole 238 and the second polysilicon plug 244 is deposited in the second hole 240. The first polysilicon plug 242 and the second polysilicon plug 244 may be a N+ doped silicon or P+ doped silicon. In addition, a diffusion layer may be disposed before the first polysilicon plug 242 or the second polysilicon plug 244 is deposited. The diffusion layer may be arsenic or other suitable material that reduces the diffusion between the doped region 234 and the first polysilicon plug 242 or between the doped region 234 and the second polysilicon plug 244. The first polysilicon plug 242 and the second polysilicon 244 may be disposed over a portion of the doped region 234 or over the entire doped region 234 in the respective holes, 238 and 240. In the FIG. 17, a first conductive material 246 is disposed in the first hole 238 over the first polysilicon plug 242. Likewise, a second conductive material 248 is disposed in the second hole 240 over the second polysilicon plug 244. The first conductive material 246 and the second conductive material 248 may be a metal or other conductive material.

Figure 18:
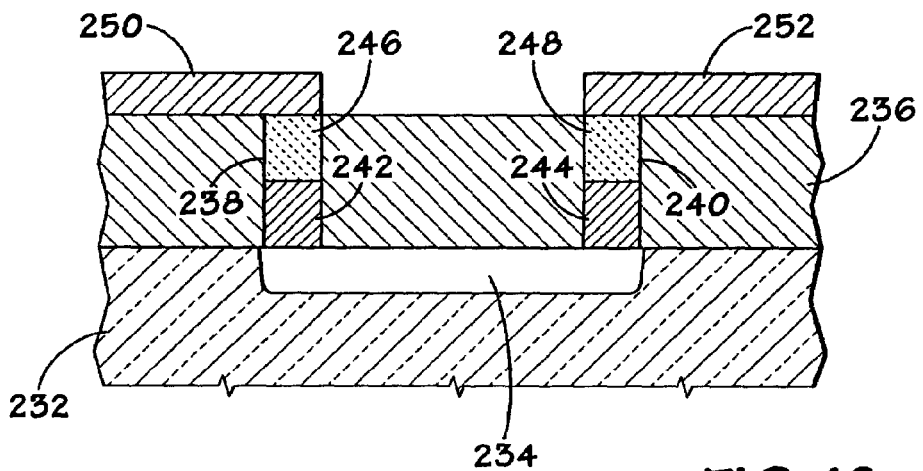

In turning to FIG. 18, a third conductive material 250 is disposed over the dielectric material 236, the first hole 238, and the first conductive material 246. Similarly, a fourth conductive material 252 is disposed over the dielectric material 236, the second hole 240, and the second conductive material 248. The third conductive material 250 and the fourth conductive material 252 may be over all or a portion of the respective holes, 238 and 240. The third conductive material 250 and the fourth conductive material 252 may be a metal or any other conductive material. In addition, other layers or materials may be to the present process. Other materials may include arsenic, or other suitable materials that enhance the connection between layers of different materials.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A diode comprising:
 a substrate having a doped region found in a bulk region of the substrate;
 a dielectric layer disposed over the doped region of the substrate, the dielectric layer having a first contact hole and a second contact hole;
 a first polysilicon plug disposed in the first contact hole;
 a second polysilicon plug disposed in the second contact hole, the second polysilicon plug being doped opposite the first polysilicon plug;
 a first conductive material disposed in the first contact hole over the first polysilicon plug;
 a second conductive material disposed in the second contact hole over the second polysilicon plug;
 a third conductive material coupled to the first conductive material; and
 a fourth conductive material coupled to the second conductive material.

2. The diode, as set forth in claim 1, wherein the bulk region of the substrate is P doped.

3. The diode, as set forth in claim 2, wherein the doped region is a N+ doped silicon, the first polysilicon plug is N+ doped, and the second polysilicon plug is P+ doped.

4. The diode, as set forth in claim 2, wherein the doped region is a P+ doped silicon, the first polysilicon plug is N+ doped, and the second polysilicon plug is P+ doped.

5. The diode, as set forth in claim 1, wherein the bulk region of the substrate is N doped.

6. The diode, as set forth in claim 5, wherein the doped region is a N+ doped silicon, the first polysilicon plug is N+ doped, and the second polysilicon plug is P+ doped.

7. The diode, as set forth in claim 5, wherein the doped region is a P+ doped silicon, the first polysilicon plug is N+ doped, and the second polysilicon plug is P+ doped.

8. The diode, as set forth in claim 1, wherein the first conductive material comprises a metal.

9. The diode, as set forth in claim 1, wherein the second conductive material comprises a metal.

10. The diode, as set forth in claim 1, wherein the first and second contact holes are entirely disposed over the doped region.

11. The diode, as set forth in claim 1, comprising a PN junction formed between the first or second polysilicon plug and the doped region of the substrate, wherein the PN junction has a cross-sectional area generally defined by the first or second contact hole adjacent the PN junction.

12. A memory device comprising:
a voltage clamp having a first diode and a second diode coupled, wherein the first diode and the second diode comprise;
a substrate having a doped region found in a bulk region of the substrate;
a dielectric layer disposed over the doped region of the substrate, the dielectric layer having a first contact hole and a second contact hole;
a first polysilicon plug disposed in the first contact hole;
a second polysilicon plug disposed in the second contact hole, the second polysilicon plug being doped opposite the first polysilicon plug;
a first conductive material disposed in the first contact hole over the first polysilicon plug;
a second conductive material disposed in the second contact hole over the second polysilicon plug;
a third conductive material coupled to the first conductive material; and
a fourth conductive material coupled to the second conductive material;
a pad coupled to receive an input signal, the pad being electrically coupled to the voltage clamp; and
a circuit being coupled to the pad via the voltage clamp.

13. The memory device, as set forth in claim 12, wherein the bulk region of the substrate is P doped.

14. The memory device, as set forth in claim 13, wherein the doped region is a N+ doped silicon, the first polysilicon plug is N+ doped, and the second polysilicon plug is P+ doped.

15. The memory device, as set forth in claim 13, wherein the doped region is a P+ doped silicon, the first polysilicon plug is N+ doped, and the second polysilicon plug is P+ doped.

16. The memory device, as set forth in claim 12, wherein the bulk region of the substrate is N doped.

17. The memory device, as set forth in claim 16, wherein the doped region is a N+ doped silicon, the first polysilicon plug is N+ doped, and the second polysilicon plug is P+ doped.

18. The memory device, as set forth in claim 16, wherein the doped region is a P+ doped silicon, the first polysilicon plug is N+ doped, and the second polysilicon plug is P+ doped.

19. The memory device, as set forth in claim 12, wherein the first conductive material comprises a metal.

20. The memory device, as set forth in claim 12, wherein the second conductive material comprises a metal.

21. A diode comprising:
a substrate having a doped region found in a bulk region of the substrate, wherein the doped region is a P+ doped silicon or an N+ doped silicon;
a dielectric layer disposed over the doped region of the substrate, the dielectric layer having a first contact hole and a second contact hole;
a first polysilicon plug disposed in the first contact hole, wherein the first polysilicon plug is N+ doped or P+ doped;
a second polysilicon plug disposed in the second contact hole, the second polysilicon plug being doped opposite the first polysilicon plug;
a first conductive material disposed over the first polysilicon plug; and
a second conductive material disposed over the second polysilicon plug.

22. The diode, as set forth in claim 21, wherein the first conductive material comprises a metal.

23. The diode, as set forth in claim 21, wherein the second conductive material comprises a metal.

24. The diode, as set forth in claim 21, wherein the first and second contact holes are entirely disposed over the doped region.

25. The diode, as set forth in claim 21, wherein the bulk region of the substrate is P doped.

26. The diode, as set forth in claim 21, comprising a PN junction formed between the first or second polysilicon plug and the doped region of the substrate, wherein the PN junction has a cross-sectional area generally defined by the first or second contact hole adjacent the PN junction.

27. A diode comprising:
a substrate having a doped region found in a bulk region of the substrate, wherein the doped region is a P+ doped silicon or an N+ doped silicon;
a dielectric layer disposed over the doped region of the substrate, the dielectric layer having a first contact hole and a second contact hole;
a polysilicon plug disposed in the first contact hole, wherein the polysilicon plug is doped opposite the doped region;
a first conductive material disposed in the second contact hole;
a second conductive material disposed in the first contact hole over the first polysilicon plug;
a third conductive material coupled to the second conductive material; and
a fourth conductive material coupled to the first conductive material;
wherein no additional polysilicon plug is disposed within the second contact hole.

28. The diode, as set forth in claim 27, wherein the first conductive material comprises a metal.

29. The diode, as set forth in claim 27, wherein the second conductive material comprises a metal.

30. The diode, as set forth in claim 27, wherein the first and second contact holes are entirely disposed over the doped region.

31. The diode, as set forth in claim 27, wherein the bulk region of the substrate is P doped.

32. The diode, as set forth in claim 27, comprising a PN junction formed between the polysilicon plug and the doped region of the substrate, wherein the PN junction has a cross-sectional area generally defined by the first contact hole.

33. A diode comprising:
- a substrate having a doped region found in a bulk region of the substrate, wherein-the doped region is a P+ doped silicon or an N+ doped silicon;
- a dielectric layer disposed over the doped region of the substrate, the dielectric layer having a first contact hole and a second contact hole;
- a first polysilicon plug disposed in the first contact hole, wherein the first polysilicon plug is N+ doped or P+ doped;
- a second polysilicon plug disposed in the second contact hole, the second polysilicon plug being doped opposite the first polysilicon plug such that a PN junction of the diode is formed between the first or second polysilicon plug and the doped region of the substrate, wherein the PN junction has an outer perimeter generally defined by the first or second contact hole adjacent the PN junction;
- a first conductive material disposed over the first polysilicon plug; and
- a second conductive material disposed over the second polysilicon plug.

34. The diode, as set forth in claim 33, wherein the first conductive material comprises a metal.

35. The diode, as set forth in claim 33, wherein the second conductive material comprises a metal.

36. The diode, as set forth in claim 33, wherein the first and second contact holes are entirely disposed over the doped region.

37. The diode, as set forth in claim 33, wherein the bulk region of the substrate is P doped.

38. A diode comprising:
- a substrate having a doped region found in a bulk region of the substrate, wherein the doped region is a P+ doped silicon or an N+ doped silicon;
- a dielectric layer disposed over the doped region of the substrate, the dielectric layer having a first contact hole and a second contact hole;
- a polysilicon plug disposed in the first contact hole, wherein the polysilicon plug is doped opposite the doped region such that a PN junction of the diode is formed between the polysilicon plug and the doped region, and wherein the PN junction has an outer perimeter generally defined by the first contact hole;
- a first conductive material disposed in the second contact hole;
- a second conductive material disposed in the first contact hole over the first polysilicon plug;
- a third conductive material coupled to the second conductive material; and
- a fourth conductive material coupled to the first conductive material.

39. The diode, as set forth in claim 38, wherein the first conductive material comprises a metal.

40. The diode, as set forth in claim 38, wherein the second conductive material comprises a metal.

41. The diode, as set forth in claim 38, wherein the first and second contact holes are entirely disposed over the doped region.

42. The diode, as set forth in claim 38, wherein the bulk region of the substrate is P doped.

* * * * *